United States Patent

Hayashi et al.

[11] Patent Number: 5,825,064
[45] Date of Patent: Oct. 20, 1998

[54] SEMICONDUCTOR VOLATILE/NONVOLATILE MEMORY

[75] Inventors: Yutaka Hayashi, Tsukuba; Yoshikazu Kojima, Tokyo; Ryoji Takada, Tokyo; Masaaki Kamiya, Tokyo, all of Japan

[73] Assignee: Agency of Industrial Science and Technology and Seiko Instruments Inc., Japan

[21] Appl. No.: 25,822

[22] Filed: Mar. 3, 1993

Related U.S. Application Data

[63] Continuation of Ser. No. 492,085, Mar. 12, 1990, abandoned.

[30] Foreign Application Priority Data

Mar. 10, 1919 [JP] Japan ......................................... 1-58173

[51] Int. Cl.⁶ .......................... H01L 29/788; H01L 29/76
[52] U.S. Cl. .......................... 257/316; 257/317; 257/319; 257/321; 257/322
[58] Field of Search ......................... 357/23.5; 257/315, 257/316, 317, 318, 319, 320, 321, 322

[56] References Cited

U.S. PATENT DOCUMENTS

| | | | |
|---|---|---|---|
| 4,288,863 | 9/1981 | Adam | 357/23.5 |
| 4,686,558 | 8/1987 | Adam | 357/23.5 |
| 4,729,115 | 3/1988 | Kauffmann et al. | 357/23.5 |
| 4,752,912 | 6/1988 | Guterman | 359/23.5 |
| 4,870,615 | 9/1989 | Maruyama et al. | 357/23.5 |
| 4,924,278 | 5/1990 | Logie | 357/23.5 |

FOREIGN PATENT DOCUMENTS 2300391  9/1976  France .

OTHER PUBLICATIONS

D.C. Guterman, "High Density 5 Volt–Only Compatible Non–volatile RAM Cell", International Electron Devices Meeting Technical Digest, 13–15 Dec. 1982, San Francisco, USA, pp. 728–732.

Primary Examiner—Ngân V. Ngô
Attorney, Agent, or Firm—Adams & Wilks

[57] ABSTRACT

The semiconductor nonvolatile memory has integrated memory cells, each being operative to carry out writing and reading of information in random-access basis and having an electric charge storage structure effective to memorize the information in nonvolatile state. The information is temporarily written into each memory cell in volatile state, and thereafter the temporarily written information is written at one into the respective electric charge storage structure of each memory cell, thereby effecting quick writing of nonvolatile information into the respective memory cells of multi-bits.

17 Claims, 4 Drawing Sheets

SEMICONDUCTOR VOLATILE/NONVOLATILE MEMORY

This is a continuation of application Ser. No. 07/492,085 filed Mar. 12, 1990, now abandoned.

BACKGROUND OF THE INVENTION

The present invention relates to a semiconductor nonvolatile memory which can store information even when the power supply is turned off, and relates to the method of writing such a nonvolatile memory.

There have been proposed various types of the conventional nonvolatile memory elements (memory cells) such as MAOS type, FAMOS type, MIOS type and so on. In view of their structures, these memories are different from each other. For example, as an electric charge storage structure for nonvolatile storing of logic information in the form of electric charge, an electroconductive film buried in an electrically insulating layer (i.e. floating gate) can be used. Or, a multilayer of dielectric materials and ferroelectric film can be utilized. Further, there have been various injection and extraction methods of selectively injecting and extracting electric charge into and from the electric charge storage structure in order to change the charged state of the storage structure. These methods include avalanche injection, tunnel injection, channel injection, and tunnel extraction of electric charge from the electric charge storage structure to change the charged state oppositely to the polarity of the extracted electric charge.

The charged state of individual memory cells can be erased concurrently by irradiation of with ultraviolet ray or X-ray. Further, by a suitable combination of these electric charge injection and extraction methods, one polarity type of electric charge is restored into or extracted from the storage structure which has stored the other polarity type of electric charge to enable electrical erasing and rewriting of memorized contents. These types of memories are called EAROM and $E^2$PROM.

A semiconductor region is formed in opposed relation to the electric charge storage structure or an insulating gate region is electrically coupled to the electric charge storage structure for use in feeding electric charge to be injected into the electric charge storage structure and for use in receiving electric charge extracted from the storage structure.

Moreover, in practical IC devices, these various types of nonvolatile memory element (memory cell) are combined with a static RAM cell so as to perform the function of a RAM (random access memory). Very recently, it has been proposed in Japanese Patent Application No. 4635/1987 that the change of surface potential of the aforementioned semiconductor region can be utilized for random-access writing or temorary writing prior to nonvolatile writing.

This random-access writing method is conventionally applied to the nonvolatile memory cell; however, when carrying out random-access reading without effecting nonvolatile writing, the information is automatically erased. Moreover, the smaller the size of the memory cell, the smaller the read signal to cause serious drawback. Further, according to this conventional method, when the memory cell has a relatively small efficiency of the electric charge capture in the storage structure, the S/N ratio of the signal representative of the nonvolatile memory contents becomes worse, thereby making difficult the commercial use.

SUMMARY OF THE INVENTION

An object of the invention is to provide a memory which can be used as a volatile memory and nonvolatile memory and which can avoid erasing of information even after carrying out random-access reading, and another object is to provide a method of writing such a memory.

In order to realize the above noted objects, the inventive semiconductor nonvolatile memory is comprised of integrated memory cells in an array, each memory cell comprising a first semiconductor region having a first surface, an electric charge storage structure disposed on the first surface of the first semiconductor region for storing electric charge, a first gate provided to electrically connect to the electric charge storage structure, a second semiconductor region electrically connected at its one side to the first semiconductor region and having a second surface, a second gate for controlling the second surface, a third region electrically connected to the other side of the second semiconductor region, and random-access potential setting means connected to the second gate for setting a potential thereof on a random access basis. Further, in the inventive memory array, the following writing method is employed to instantly write multi-bits of information in a volatile state. Namely, the writing method of the semiconductor nonvolatile memory is comprised of the step of applying a given potential to the second gate by the random-access potential setting means an a random access basis to thereby temporarily write volatile information prior to applying a voltage to the first gate to effect writing of nonvolatile information, and the step of thereafter applying concurrently according to a nonvolatile writing instruction a nonvolatile writing voltage to the first gate of all the memory cells to be written so as to effect nonvolatile writing of the temporarily written volatile information into the electric charge storage structure.

In each memory cell, the first and second semiconductor regions may contact directly with each other, or may be electrically connected through a fourth region or channel. In the present specification, both of these relations are encompassed by the description that the first and second semiconductor regions are electrically connected to each other. In a similar sense, the second and third regions are electrically connected to each other in the inventive structure.

The electric charge storage structure can be formed of a multi-layer of dielectric films, an electro-conductive material buried in an insulating layer, or ferroelectric material. When the electro-conductive material extends horizontally outside the first surface of the first semiconductor, the first insulating gate is not necessarily disposed over the surface of the first semiconductor region, but may be capacitively coupled to the electroconductive material through an insulating film. Further, in case the electric charge storage structure is composed of a multi-layer dielectric material or ferroelectric film, the first gate electrode is disposed on the first surface of the first semiconductor through an insulating film or the electric charge storage structure. According to a potential applied to the first gate electrode, the potential of the semiconductor surface of the first semiconductor region and the electric field of the electric charge storage structure or the electric field of an insulating film in contact with the storage structure can be controlled to effect the injection and extraction of electric charge into and from the electric charge storage structure. Namely, the charged state of the storage structure can be changed.

As used in the present specification, the expression "electrically coupled" means that the first gate and the electric charge storage structure are capacitively coupled to each other, or that the first gate is constructed to apply an electric field to the electric charge storage structure. The expression "electrically connected second region" means that, when the first semiconductor region is composed of a channel of the buried type, the second region is a region in ohmic contact with the first semiconductor region, or that, when an inverted region is formed on the first semiconductor region, the second region is a region effective to transfer carriers to and from the inverted channel. A fourth region may be interposed between the first and second semiconductor regions. Further, the third and second regions are also electrically connected to each other. In most cases, the third region is composed of a semiconductor region. A region composed of metal or silicide may function as the third region.

Further, the random-access potential setting means can be composed of a switching element such as a diode and transistor connected to the second gate and function to set the potential of the second gate according to information to be written and thereafter to maintain temporarily the set potential for a relatively long duration. The time needed for setting of the potential is far smaller than the time needed for carrying out nonvolatile writing. Consequently, information can be quickly set to multi-bits of memory cells just prior to carrying out the nonvolatile writing. When carrying out the nonvolatile writing, the volatile or temporary information just set in multi-bits of the memory cells is connected into the corresponding nonvolatile information in the storage structure.

As described above, according to the present invention, the semiconductor nonvolatile memory is comprised of integrated memory cells, each memory cell comprising a first semiconductor region having a first surface, an electric charge storage structure disposed on the first surface of the first semiconductor region for storing electric charge, a first gate to electrically connect to the electric charge storage structure, a second semiconductor region electrically connected at its one side to the first semiconductor region and having a second surface, a second gate for controlling the second surface, a third region electrically connected to the other side of the second semiconductor region, and random-access potential setting means connected to the second gate for setting a potential thereof on a random access basis. The volatile information is written into the second gate by the random-access setting means, and then a high voltage is applied to the first gate so as to write the volatile information written in the second gate into the electric charge storage structure as the corresponding nonvolatile information in response to impedance of the first and second semiconductor regions.

DETAILED DESCRIPTION OF THE INVENTION

Figure 1:
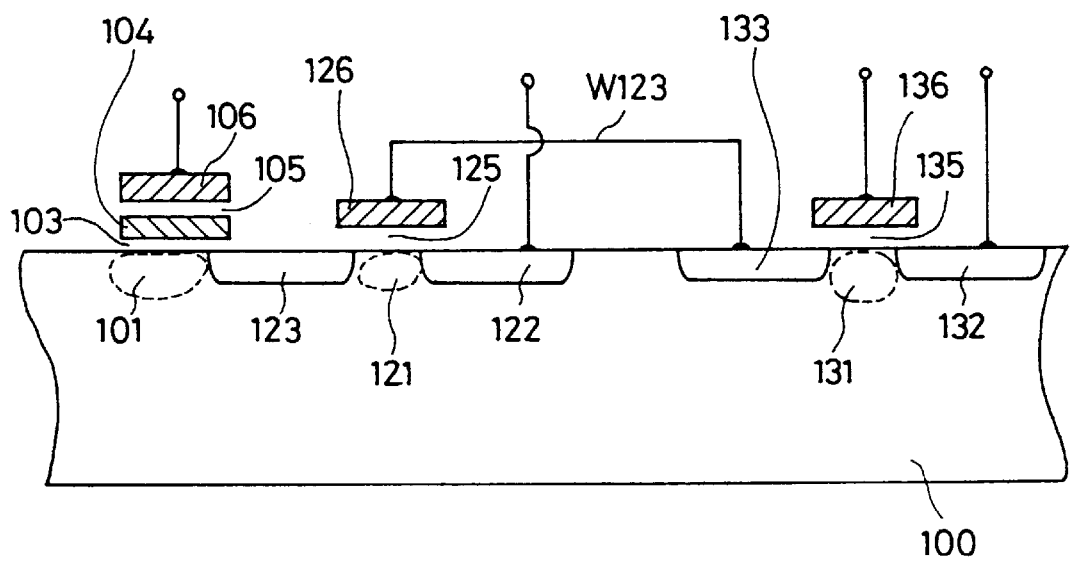
FIG. 1 is a sectional view of a first embodiment the semiconductor nonvolatile memory cell according to the present invention.

Hereinafter, the inventive nonvolatile memory and the writing method of the nonvolatile memory are described in conjunction with the drawings showing embodiments of memory cells which constitute the nonvolatile memory device. FIG. 1 is a sectional view of a first embodiment of the semiconductor nonvolatile memory cell. The memory cell is comprised of a semiconductor substrate 100, a first semiconductor region 101 of a first conductivity type (for example, P type) and a floating gate 104 made of polysilicon etc. or an electric charge storage structure composed of silicon nitride, etc. In the FIG. 1 embodiment, the electric charge storage structure is formed on a surface of the first semiconductor region 101 through a thin insulating film 103 effective to pass tunnel electrons. A first gate 106 is formed on the electric charge storage structure 104 through an insulating film 105 and functions to control the potential of the electric charge storage structure 104. The first semiconductor region 101 is electrically connected to a second semiconductor region 121 of the first conductivity type through a region 123 of the opposite conductivity type. In this first embodiment, a third region is composed of a semiconductor region 122 of the opposite conductivity type, which is in contact with the second semiconductor region 121. A second gate 126 is formed on a surface of the second semiconductor region 121 through an insulating film 125. The second gate 126 operates to control a channel of the opposite conductivity type on the surface of the second semiconductor region 121.

Random-access potential setting means is composed of a field effect transistor comprised of a drain region 132, a source region 133, a channel-forming region 131, a gate 136 and a gate insulating film 135. The source region 133 of this random-access potential setting means is connected to the second gate 126. Therefore, by applying a positive potential $V_G$ (in case of the N channel) to the gate 136 and by applying to the drain region 132 positive potential $V_S$, the second gate 126 is set to the potential level of $V_S$ provided that $V_G-V_{TH}>V_S$ ($V_{TH}$ denotes the threshold voltage of the channel-forming region 131). Then, even after resetting the potential level of the gate 136 to 0V, the potential of the second gate 126 is held at around $V_s$ within a time interval of current discharge in the form of junction leak current between the regions 133 and 131. On the other hand, when the potential of the drain region 132 is set initially at 0V, the second gate is held at 0V for a long time. Accordingly, when the value of $V_s$ is greater than the gate threshold voltage of the second gate 126, the channel on the semiconductor region 121 is placed in a low impedance state. Therefore, by holding a potential of the region 122, the potential of the region 123 is accordingly held. When the valve of $V_s$ is below the gate threshold voltage of the second gate 126, the surface channel of the semiconductor region 121 is placed in a high impedance state. Therefore, the potential of the region 123 is not fixed.

Namely, in the FIG. 1 memory cell, when volatile information is written into the second gate 126 in the form of the potential level $V_s$ through the random-access potential setting means, the impedance of the region 121 is controlled according to the written volatile information. Namely, the volatile information is converted into the change of the impedance. Under this state, by applying a high voltage to the gate 106, when the channel on the semiconductor region 121 is in the low impedance state, electrons are injected from the semiconductor region 101 to the electric charge storage structure 104 through the insulating film 103. At this time, since the low impedance state is maintained during the injection of carriers to the electric charge storage structure 104, the injected electrons are supplied from the region 122 during a programming time. On the other hand, the channel on the surface of the semiconductor region 121 is held in the high impedance state, and the potential of the region 123 is not fixed so that the semiconductor region 101 is depleted. Therefore, the insulating film 103 is not applied with a great electric field so that electrons are not injected so much into the storage structure 104. Consequently, by applying a high voltage to the gate 106, the volatile information can be converted into the corresponding nonvolatile information in the form of binary data "1" or "0" in an amplified state. Namely, the volatile information which is temporarily written into the second gate 126 through the random-access potential setting means is converted into the corresponding nonvolatile information in the electric charge storage structure 104 with a logic amplitude greater than that of the volatile information.

When reading out the nonvolatile information, while a constant voltage is applied to the gate 106, the charging capacity of the semiconductor region 101 is monitored. Namely, when the electric charge storage structure 104 does not store many electrons, a great amount of electrons can be charged into the semiconductor region 104. On the other hand, when the electric charge storage structure 104 has been injected with a great amount of electrons, only a small amount of electrons can be charged into the semiconductor region 101. The charged amount can be detected at the region 122 through the field effect transistor having the second gate 126. In this embodiment, since the writing of the nonvolatile information utilizes the impedance change of the semiconductor region 121, the logic amplitude of the nonvolatile memory can be set greater than the power source voltage.

Figure 2:
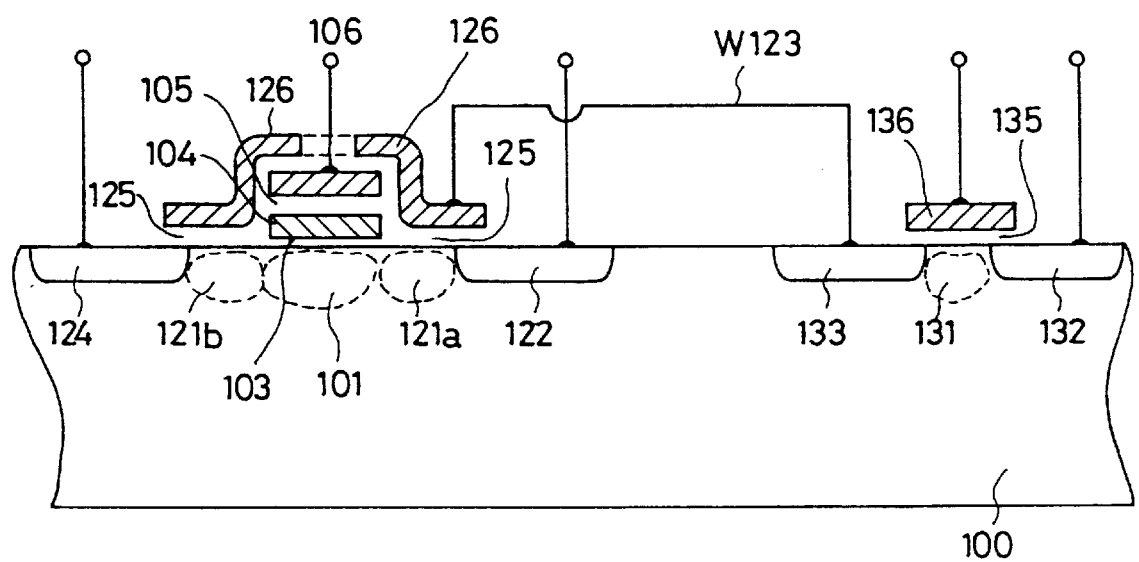
FIGS. 2–4 are sectional views of other embodiments of the inventive semiconductor nonvolatile memory cell.

FIG. 2 is a sectional view of a second embodiment of the inventive semiconductor nonvolatile memory cell. The FIG. 2 memory cell is operated to carry out the writing in the same manner as that of the FIG. 1 memory cell; however, the reading can be carried out staticly. A first semiconductor region 101 is directly connected to a second semiconductor region 121a without interposing a region like the FIG. 1 region 123, and an additional region 124 is formed oppositely to a third semiconductor region 122 with respect to a first gate 106. In the FIG. 2 embodiment, similarly, by applying voltages to a gate electrode 136 and to a drain region 132, volatile information can be temporarily written into a second gate 126 in the form of 0V potential or positive potential $V_S$. By setting the value of the positive potential $V_S$ more than a threshold voltage of the second semiconductor region 121a, when the potential of the third semiconductor region 122 is fixed, the surface channel of the second semiconductor region 121a is set selectively to one of low impedance state and high impedance state according to the information temporarily written in the gate 126. Namely, when the gate 126 is set to the potential 0V, the surface channel of the second semiconductor region 121a is held at the high impedance state. Accordingly, when the second gate 126 is written with the volatile information by the random-access potential setting means comprised of the gate 136 and the drain 126, the volatile information is transferred to the second semiconductor region 121a in the form of the magnitude of the surface channel impedance. At this condition, by applying a high voltage to the first gate 106, when the surface channel of the region 121a is held at the low impedance state, the first semiconductor region 101 is accordingly placed in a low impedance state. Consequently, electrons supplied from the region 122 pass through the surface channel of the second semiconductor region 121a and the surface channel of the first semiconductor region 101, and then pass through the thin insulating film 103 to inject into the electric charge storage structure 104. The injected electrons are continuously supplied from the region 122 during a writing time interval, because the low impedance state of the surface channel of the region 121a can be maintained as it is even during the course of the injection to the electric charge storage structure 104. On the other hand, in the condition that the second semiconductor region 121a is held at the high impedance state, even if a high voltage is applied to the gate 106, electrons cannot be supplied from the region 122 to the electric charge storage structure 104 because the first semiconductor region 101 is held at the high impedance state. As used in this specification hereinafter, the expression "semiconductor region is held low/high impedance" means the fact that the channel is built up on the surface of the semiconductor region and the channel is held at the low/high impedance state.

Besides the above described tunnel injection, it should be noted that channel injection can be utilized to inject electrons from the semiconductor region 101 to the electric charge storage structure 104. In such case, unlike the FIG. 2 embodiment, the additional region 124 is directly connected to the semiconductor region 101 (i.e., the region 121b is eliminated) to provide a modified embodiment. In such the embodiment, by applying a high voltage to the region 124, when the first semiconductor region 101 and the second semiconductor region 121a are held in a low impedance state, channel hot electrons are generated on the surface of the first semiconductor region 101 and some of the electrons are injected into the electric charge storage structure 104. On the other hand, when the second semiconductor region 121a is held at a high impedance state, channel hot electrons are not generated on the surface of the semiconductor region 101 so that no electrons are injected into the electric charge storage structure 104. Thus, by the channel injection as well, the volatile information written into the second semiconductor region 121a is transferred to the electric charge storage structure to thereby program the corresponding nonvolatile information.

In the FIG. 2 embodiment, the programmed nonvolatile information is read in terms of a change of impedance between the region 122 and the region 124 as described below. Namely, under the state that a positive voltage is applied to the gate 106 and gate 126, the second semiconductor regions 121a and 121b are held in a low impedance state, while the interposed first semiconductor region 101 has a varying impedance depending on the amount of electrons stored in the electric charge storage structure 104. When many electrons are stored, the first semiconductor region 101 is held at high impedance so that the substrate surface is accordingly held at high impedance between the region 122 and the other region 124. On the other hand, when not many electrons are stored in the electric charge storage structure 104, the first semiconductor region 101 is held at low impedance so that the detected impedance is accordingly low between the regions 122 and 124.

Figure 3:
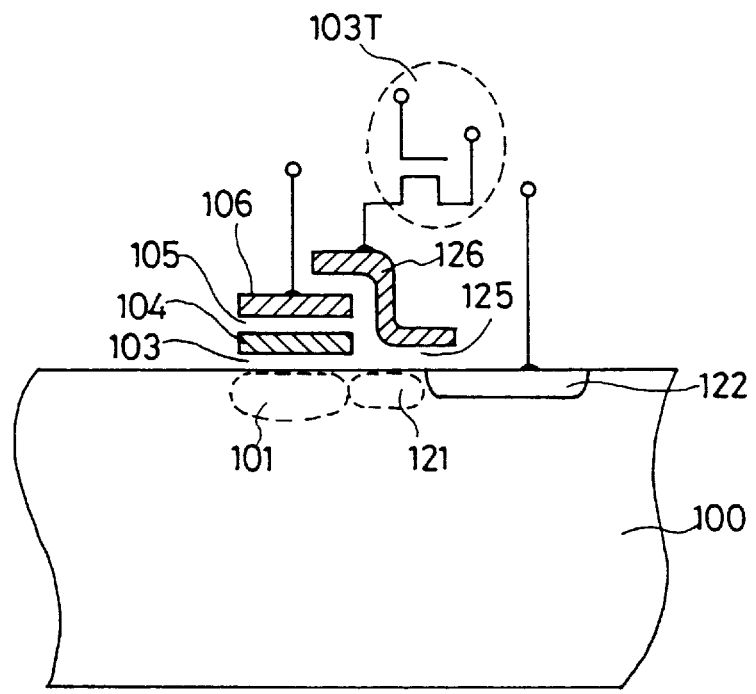
Figure 4:
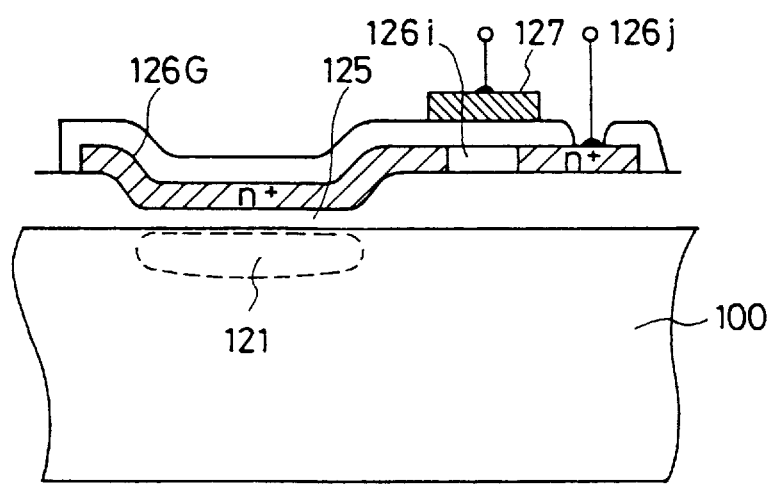

FIG. 3 is a sectional view showing a third embodiment of the inventive semiconductor nonvolatile memory cell. In FIG. 3, a volatile information input transistor 130T, which operates as the random-access potential setting means, is formed on an insulating film disposed on a substrate 1. In detail, this volatile information input transistor has a sectional structure as shown in FIG. 4. Source region 126G and drain region 126j are formed of polysilicon film or monocrystalline silicon film. The conductance of a region 126i is controlled by a potential applied to a gate 127 so that the potential level of the drain region 126j is transferred to set the potential of the source region 126G, a part of which constitutes the second gate 126. The FIG. 3 memory cell operates in a manner similar to the FIG. 1 memory cell. The volatile information input transistor 103T of the FIG. 3 embodiment can be replaced by diodes $D_p$, $D_n$ as shown in FIG. 6, which will be described later, to constitute a memory cell which will operate in a manner similar to the FIG. 2 embodiment.

Figure 5:
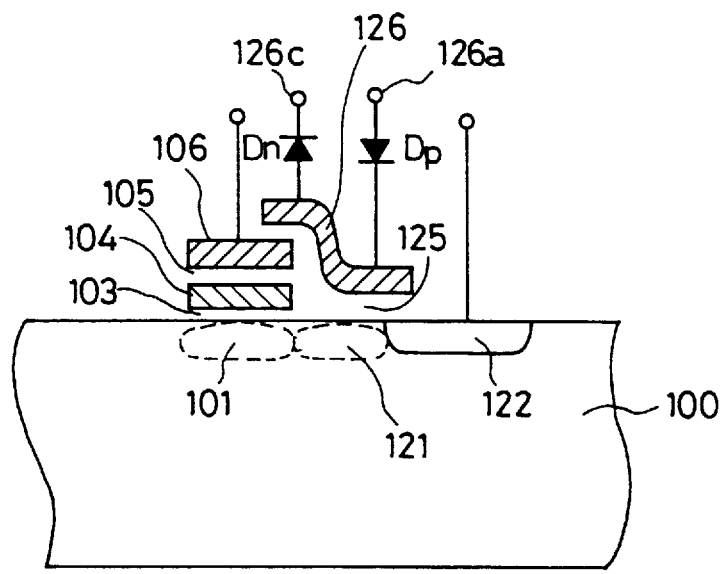
FIGS. 5–7 are sectional views of the inventive semiconductor nonvolatile memory cell, in which diodes are used as volatile information setting means.
Figure 6:
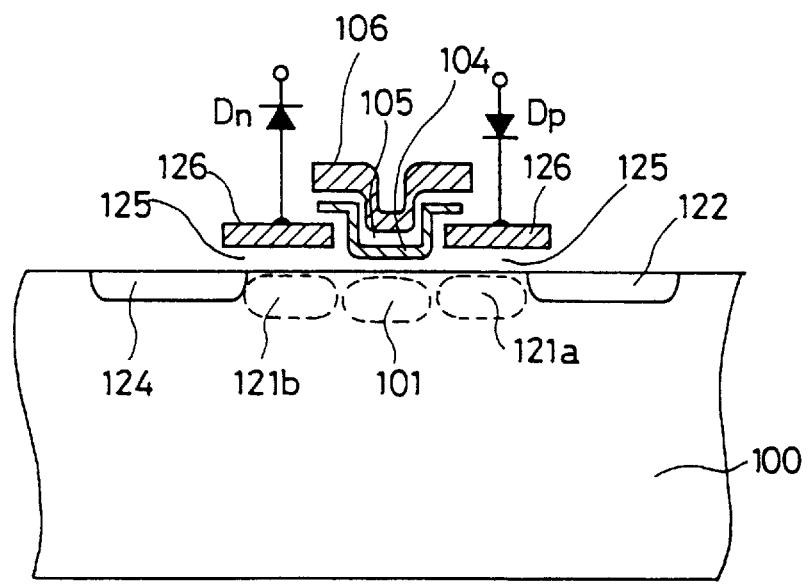

FIGS. 5 and 6 are sectional views of memory cells, showing fourth and fifth embodiments, respectively, of the inventive semiconductor nonvolatile memory in which a diode arrangement is provided to function as the random-access potential setting means. A pair of diodes $D_n$ and $D_p$ are connected to the second gate 126. According to the function of the diodes $D_n$ and $D_p$, the potential level of the second gate 126 can be set in a range from 0V to $V_s$, i.e., the difference between the power source voltage and the forward voltage of the diode so as to write volatile information on an random access basis. The written volatile information is transferred to the electric charge storage structure 104 in form of the corresponding nonvolatile information in a manner similar to the FIGS. 1 and 2 embodiments. Further the nonvolatile information is read out by detecting the impedance of the semiconductor region 101.

Figure 7:
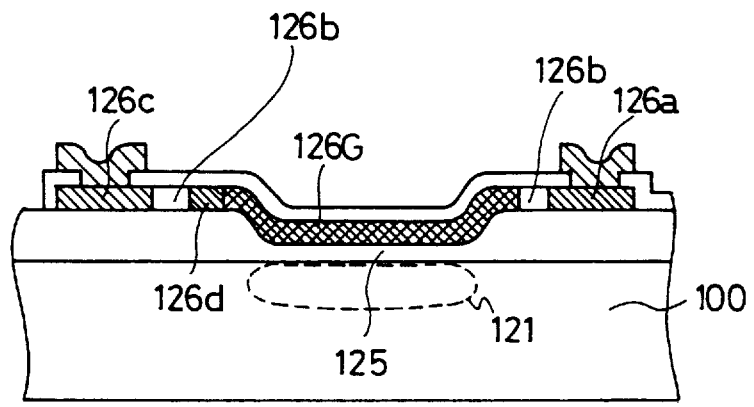

FIG. 7 is a sectional view showing the detailed structure of the diodes $D_n$ and $D_p$ which function as the potential setting means as shown in the FIGS. 5 and 6 embodiments. Diodes are comprised of PN junctions formed in a polysilicon film disposed on a substrate 100. Namely, the diode $D_n$ is comprised of $N^+$ type polysilicon film section 126c, N or P type polysilicon film section 126b and $P^+$type polysilicon film section 126d, and the other diode $D_p$ is comprised of $N^+$type polysilicon film section 126G which constitutes the second gate 126, N or P type polysilicon film section 126b and $P^+$ type polysilicon film section 126a. In the aforementioned embodiments shown in FIGS. 3–7, the information input transistor and diodes are composed of polysilicon film or single crystal silicon film. These polysilicon film and single crystal silicon film are continuous to or formed commonly with polysilicon film or single crystal silicon film of the second gate. By such a construction, lead patterns can be eliminated between the transistor or diodes and the second gate, thereby reducing the area dimension of each memory cell.

Figure 8:
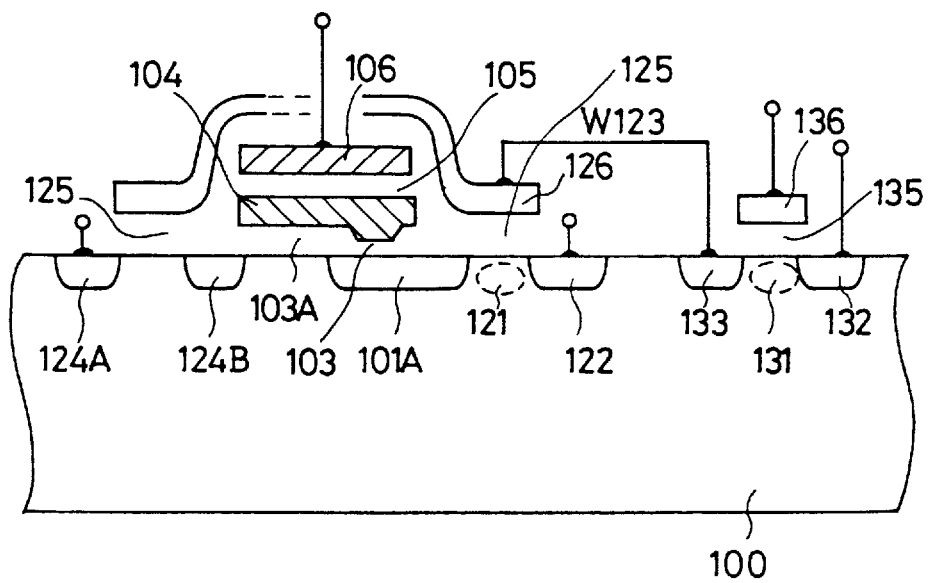
FIG. 8 is a sectional view showing another embodiment of the inventive nonvolatile memory cell.

In the aforementioned embodiments of the present invention, the first semiconductor region is comprised of a channel region; however, the first semiconductor region is not necessarily limited to the channel region as shown in FIG. 8. FIG. 8 is a section of an embodiment of the memory cell which constitutes the inventive semiconductor nonvolatile memory, in which the first semiconductor region is composed of an $N^+$type impurity-doped region. An $N^+$ type of first semiconductor region 101A is formed in a surface portion of a P type silicon substrate 100. An electric charge storage structure 104 is formed on the region 101A through an insulating film including partly a thin tunnel insulating film 103. Further, a first gate 106 is formed on the structure 104 through another insulating film 105. The electric charge storage structure 104 has a function to control the conductance of a channel between $N^+$ type impurity-doped region and the first semiconductor region 101A on the surface of the semiconductor substrate 100. Further, the first semiconductor region 101A is electrically connected to a second semiconductor region 121, which is electrically connected to a third region 122 of $N^+$ type. A second gate 126 is formed on the second semiconductor region 121 through a gate oxide film 125. Further, the second gate 126 is connected to random-access potential setting means in the form of a transistor comprised of a source region 133, drain region 132, channel region 131, gate electrode 136 and gate insulating film 135.

The FIG. 8 embodiment operates in a manner similar to the embodiments shown in FIGS. 1–7. Namely, when the second gate 126 is set by the random-access potential setting means to a potential level effective to increase the conductance of the second semiconductor region 121, the potential level of the first semiconductor region 101A is fixed to the potential level of the $N^+$ type impurity-doped region 122. Consequently, for example, if the region 122 is set to the potential level of 0V, the potential level of the first semiconductor region 101A is accordingly made 0V. Thus, by applying a positive high voltage to the first gate 106, tunnel current flows through the thin tunnel insulating film 103 so that electrons are injected into the electric charge storage structure 104 from the first semiconductor region 101A. On the other hand, when the second gate 126 is set by the random-access potential setting means to another potential effective to decrease the conductance of the second semiconductor region 121, the potential level of the first semiconductor region 101A is floated so that electric charge is not supplied to the semiconductor region 101A even upon application of the high voltage to the first gate 106. In summary, the random-access potential setting means is operated an a random access basis to set the potential of the second gate 126 to thereby program or write the volatile information in each memory cell. Then, the volatile information is converted concurrently into the corresponding volatile information in the electric charge storage structure of each cell throughout the memory device to thereby program the information.

Further, in reading out the programmed nonvolatile information, under the state that a constant voltage is applied to the first gate 106, the value of the channel conductance is detected between the $N^+$ type impurity-doped region 124B and the first semiconductor region 101A.

In erasing the written nonvolatile information, an electrical method can be used other than irradiation of ultraviolet ray. Namely, a high voltage is applied to the $N^+$ type impurity-doped region 122 and to the second gate 126, and a voltage of 0V is applied to the first gate. Consequently, a high electric field is applied to the tunnel insulating film 103 on the first semiconductor region 101A so that electrons stored in the electric charge storage structure 104 are drawn to the first semiconductor region 101A to thereby erase the nonvolatile information. The FIG. 8 embodiment is provided with the $N^+$ type impurity-doped region 124A; however, the region 124A and a portion of the second gate 126 disposed between the region 124A and the region 124B could be eliminated to further reduce the area dimension of each memory cell.

In the above described embodiment, it should be noted that the first and second semiconductor regions can be formed directly in the surface portion of the semiconductor substrate, or can be formed in the opposite conductivity type well formed in the substrate, or can be formed in a semiconductor film disposed on an insulating film.

In the above described embodiments, electric charge is injected into the electric charge storage structure from the surface of the first semiconductor region; however, the injection could be effected from the first gate. Further, electric charge could be drawn from the electric charge storage structure to the first gate or the first semiconductor region.

Moreover, in constructing memory cells into a matrix array of a memory, a word line is connected to the gate of the transistor of the random-access potential setting means and a bit or data line is connected to the drain of the transistor so as to selectively write volatile information into each memory cell. In reading out the nonvolatile information, the first gate is connected to the word line and the third region is connected to the bit line. According to the array construction method, the drain of the transistor of the random-access potential setting means can be made common to the third region.

As described above, according to the present invention, the memory cell is comprised of random-access potential setting means composed of a diode or a transistor, and means for converting the volatile information written by the random-access potential setting means corresponding nonvolatile information in the electric charge storage structure. The construction of the memory cell is rather simple to facilitate construction of a multi-bits memory. Thus, the volatile information is written at high speed, and the volatile information is concurrently programmed into the corresponding nonvolatile information at respective memory cells of array. Further, the volatile information is written in the form of an impedance change, and this impedance change is amplified during the conversion into the corresponding nonvolatile information, thereby achieving the effect of stable programing and reading of the nonvolatile information.

What is claimed is:

1. A semiconductor nonvolatile memory having a plurality of integrated memory cells, each memory cell comprising:
    a first semiconductor region;
    an electric charge storage structure disposed over the first semiconductor region for storing electric charge;
    a first gate disposed over and electrically coupled to the electric charge storage structure;
    a second semiconductor region having opposite sides and being electrically connected at one side thereof to the first semiconductor region;
    a third region electrically connected to the other side of the second semiconductor region;
    a second gate for temporarily storing volatile information and disposed over the second semiconductor region for controlling flow of electric charge from the third region to the first semiconductor region according to the volatile information temporarily written in the second gate; and
    random-access potential setting means connected to the second gate for setting a potential thereof on a random access basis.

2. A semiconductor memory call formed on a substrate, comprising:
    storage means disposed on the substrate for storing electric charge to memorize nonvolatile information;
    injecting means for injecting electric charge into the storage means;
    supplying means for supplying electric charge to the injecting means;
    volatile control means operable to write volatile information and to temporarily maintain the volatile information, the volatile control means being interposed between the injecting means and the supplying means for controlling flow of electric charge from the supplying means to the injecting means according to the volatile information temporarily written in the volatile control means;
    random-access potential setting means for setting a potential of the volatile control means on a random access basis to write volatile information into the volatile control means, the random-access potential setting means including switching means for effecting setting of the potential of the volatile control means on a random access basis; and
    nonvolatile control means for controlling the injection of the electric charge from the injecting means to the storage means to thereby write thereinto nonvolatile information which is representative of the corresponding volatile information written in the volatile control means.

3. A semiconductor memory cell according to claim 2; wherein the storage means comprises a floating gate electrode.

4. A semiconductor memory cell according to claim 2; wherein the injecting means includes a semiconductor region effective to flow a tunnel current between the injecting means and the storage means.

5. A semiconductor memory cell according to claim 2; wherein the injecting means includes a semiconductor region effective to flow a channel current between the injecting means and the storage means.

6. A semiconductor memory cell according to claim 2; wherein the volatile control means comprises a channel region interposed between the injecting means and the supplying means for regulating the flow of electric charge according to an impedance of the channel region, and a volatile control gate electrode disposed in opposed relation to the channel region and settable to a potential level representative of the volatile information and effective to control the impedance of the channel region.

7. A semiconductor memory cell according to claim 2; wherein the switching means comprises a field effect transistor.

8. A semiconductor memory cell according to claim 2; wherein the switching means comprises a diode.

9. A semiconductor nonvolatile memory according to claim 1; wherein the first, second and third semiconductor regions are formed in a semiconductor substrate.

10. A semiconductor nonvolatile memory according to claim 9; wherein the semiconductor substrate and the third semiconductor region are of opposite conductivity types.

11. A semiconductor nonvolatile memory according to claim 1; wherein the random-access potential setting means includes switching means for effecting random access of the second gate.

12. A semiconductor memory cell formed on a substrate, comprising: storing means for storing electric charge to memorize nonvolatile information; injecting means for injecting electric charge into the storing means; supplying means for supplying electric charge to the injecting means; volatile control means for writing and temporarily maintaining volatile information, the volatile control means comprising a channel region interposed between the injecting means and the supplying means for regulating the flow of electric charge according to an impedance of the channel region, and a volatile control gate electrode disposed in opposed relation to the channel region and settable to a potential level representative of the volatile information and effective to control the impedance of the channel region, whereby the volatile control means controls the flow of electric charge from the supplying means to the injecting means according to the volatile information temporarily maintained in the volatile control means; random-access potential setting means connected with the volatile control gate electrode for setting a potential of the volatile control means on a random access basis to write the volatile information into the volatile control means; and nonvolatile control means for controlling the injection of the electric charge from the injecting means to the storing means to write nonvolatile information into the storing means corresponding to the volatile information written in the volatile control means.

13. A semiconductor memory cell according to claim 12; wherein the storing means comprises a floating gate electrode.

14. A semiconductor memory cell according to claim 12; wherein the injecting means includes a semiconductor region effective to allow a tunnel current to flow between the injecting means and the storing means.

15. A semiconductor memory cell according to claim 12; wherein the injecting means includes a semiconductor region effective to allow a channel current to flow between the injecting means and the storing means.

16. A semiconductor memory cell according to claim 12; wherein the random-access potential setting means includes switching means comprising a field effect transistor.

17. A semiconductor memory cell according to claim 12; wherein the random-access potential setting means includes switching means comprising a diode.

* * * * *